United States Patent
Kim et al.

(10) Patent No.: US 8,482,492 B2
(45) Date of Patent: Jul. 9, 2013

(54) ORGANIC LIGHT EMITTING DISPLAY WITH AN IMPROVED EMISSION CONTROL DRIVER AND METHOD OF DRIVING THE SAME

(75) Inventors: Mi-Hae Kim, Yongin (KR); Seon-I Jeong, Yongin (KR); Ki-Myeong Eom, Yongin (KR); Jin-Tae Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 581 days.

(21) Appl. No.: 12/476,189

(22) Filed: Jun. 1, 2009

(65) Prior Publication Data

US 2010/0013824 A1 Jan. 21, 2010

(30) Foreign Application Priority Data

Jul. 16, 2008 (KR) ........................ 10-2008-0069021

(51) Int. Cl.
*G09G 3/30* (2006.01)

(52) U.S. Cl.
USPC ............................................................. 345/76

(58) Field of Classification Search
USPC .................................................... 345/204, 76
See application file for complete search history.

(56) References Cited

U.S. PATENT DOCUMENTS

| | | | |
|---|---|---|---|
| 2005/0110720 A1* | 5/2005 | Akimoto et al. ................ | 345/76 |
| 2006/0022908 A1* | 2/2006 | Schwanenberger et al. .... | 345/76 |
| 2007/0063933 A1* | 3/2007 | Chung ............................ | 345/76 |
| 2007/0091033 A1* | 4/2007 | Nakamura ...................... | 345/76 |

FOREIGN PATENT DOCUMENTS

| | | |
|---|---|---|
| KR | 10-2005-0082965 | 8/2005 |
| KR | 10-2006-0010485 | 2/2006 |
| KR | 10-2006-0114470 | 11/2006 |
| KR | 10-2008-0020353 A | 3/2008 |
| KR | 10-2008-0020354 A | 3/2008 |
| KR | 10-2008-0062458 A | 7/2008 |

OTHER PUBLICATIONS

KIPO Office action dated Oct. 30, 2009, for priority Korean application 10-2008-0069021, noting Korean reference KR 10-2006-0010485, previously filed in an IDS dated Jun. 1, 2009.

KIPO Office action dated Jun. 22, 2010, for priority Korean application No. 10-2008-0069021, listing the cited reference in this IDS, as well as KR 10-2006-0010485 A, previously filed in an IDS dated Jun. 1, 2009.

\* cited by examiner

*Primary Examiner* — Adam J Snyder

(74) *Attorney, Agent, or Firm* — Christie, Parker & Hale, LLP

(57) ABSTRACT

An organic light emitting display capable of preventing erroneous emission from being generated at the initial stage of driving the organic light emitting display and a method of driving the same. The organic light emitting display includes a display unit including data lines, scan lines, emission control lines, and pixels coupled to the data lines, the scan lines, and the emission control lines. A data driver is coupled to the data lines for transmitting data signals. A scan driver is coupled to the scan lines for transmitting scan signals. An emission control driver is coupled to the emission control lines for transmitting emission control signals. A controller is provided for transmitting a plurality of control signals for controlling the data driver, the scan driver, and the emission control driver, and outputting a first control signal for preventing currents from flowing to organic light emitting diodes of the pixels.

11 Claims, 4 Drawing Sheets

ORGANIC LIGHT EMITTING DISPLAY WITH AN IMPROVED EMISSION CONTROL DRIVER AND METHOD OF DRIVING THE SAME

CROSS-REFERENCE TO RELATED APPLICATIONS

This application claims priority to and the benefit of Korean Patent Application No. 10-2008-0069021, filed on Jul. 16, 2008, in the Korean Intellectual Property Office, the entire content of which is incorporated herein by reference.

BACKGROUND OF THE INVENTION

1. Field of the Invention

The present invention relates to an organic light emitting display and a method of driving the same.

2. Description of the Related Art

Recently, various types of flat panel displays (FPD) with reduced weight and volume than those of a cathode ray tube (CRT) display have been developed. The various types of FPDs include liquid crystal displays (LCDs), field emission displays (FEDs), plasma display panels (PDPs), and organic light emitting displays.

Among the various types of FPDs, the organic light emitting displays display images by using organic light emitting diodes (OLEDs) that generate light by re-combination of electrons and holes.

The organic light emitting displays are widely used in personal digital assistants (PDAs) and MP3 players as well as in mobile telephones due to various advantages such as high color reproducibility and small thickness.

The OLED used for the organic light emitting display includes an anode electrode, a cathode electrode, and an emission layer formed between the anode electrode and the cathode electrode. In the OLED, the emission layer emits light when a current flows from the anode electrode to the cathode electrode, and the amount of the emitted light varies in accordance with a change in the amount of the current so that different levels of brightness can be displayed.

However, in a typical organic light emitting display, when a voltage difference is applied between the anode electrode and the cathode electrode of the OLED at the initial stage of driving the organic light emitting display, a current flows through the OLED, thereby causing erroneous or undesirable emission during the initial stage.

SUMMARY OF THE INVENTION

Accordingly, it is an aspect of the present invention to provide an organic light emitting display capable of preventing erroneous emission from occurring at the initial stage of driving the organic light emitting display.

According to an embodiment of the present invention, an organic light emitting display includes a display unit having data lines, scan lines, emission control lines, and a plurality of pixels coupled to the data lines, the scan lines, and the emission control lines. A data driver is coupled to the data lines for transmitting data signals. A scan driver is coupled to the scan lines for transmitting scan signals. An emission control driver is coupled to the emission control lines for transmitting emission control signals. The organic light emitting display further includes a controller for transmitting a plurality of control signals to control the data driver, the scan driver, and the emission control driver, and outputting a first control signal to prevent currents from flowing to organic light emitting diodes of the pixels.

According to an embodiment of the present invention, a method of driving an organic light emitting display is provided. The organic light emitting display includes an emission control driver and pixels having transistors for switching driving currents in response to emission control signals, each of the pixels having an organic light emitting diode for receiving a corresponding one of the driving currents in response to the switching operations of the transistors. The method includes receiving a first control signal for a time duration in which a voltage for turning off the transistors is output from the emission control driver and receiving a start signal and clocks by the emission control driver to generate the emission control signals subsequent to the time duration.

According to an embodiment of the present invention, an organic light emitting display includes a display unit having data lines, scan lines, emission control lines, and a plurality of pixels coupled to the data lines, the scan lines, and the emission control lines. A data driver is coupled to the data lines for transmitting data signals. A scan driver is coupled to the scan lines for transmitting scan signals. An emission control driver is coupled to the emission control lines for transmitting emission control signals, wherein the emission control driver is configured to prevent the pixels from emitting during an initial period after power is supplied to the display unit. During the initial period, the data signals include data corresponding to black color.

As described above, in the organic light emitting display and the method of driving the same according to the embodiments of the present invention, the emission control signals are controlled at the initial stage of driving the organic light emitting display to prevent currents from flowing to the OLEDs, thereby preventing erroneous emission from being generated.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
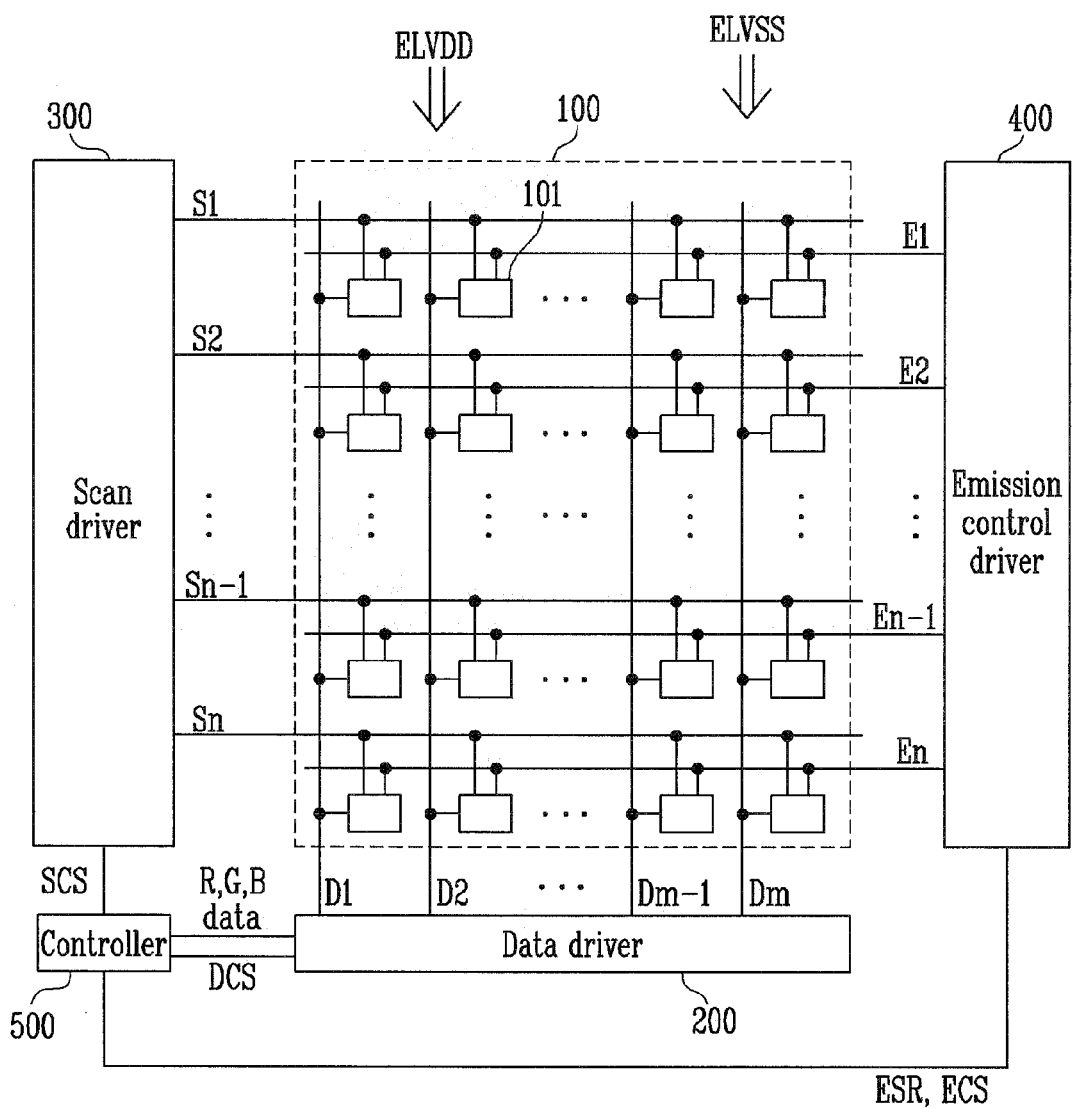
FIG. 1 is a schematic block diagram for illustrating the structure of an organic light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or indirectly coupled to the second element via a third element. Further, some of the elements that are not essential to a complete understanding of the present invention are omitted for clarity. Also, like reference numerals refer to like elements throughout.

Hereinafter, embodiments of the present invention will be described in detail with reference to the accompanying drawings.

FIG. 1 illustrates the structure of an organic light emitting display according to an embodiment of the present invention. Referring to FIG. 1, the organic light emitting display includes a display unit 100, a data driver 200, a scan driver 300, an emission control driver 400, and a controller 500.

In the display unit 100, a plurality of pixels 101 are arranged, and each of the pixels 101 includes an organic light emitting diode (OLED) that emits light corresponding to the flow of current through the OLED. In addition, the display unit 100 includes n scan lines S1, S2 . . . , Sn−1, and Sn extending in a row direction for transmitting scan lines, n emission control lines E1, E2 . . . , En−1, and En extending in the row direction for transmitting emission control signals, and m data lines D1, D2 . . . , Dm−1, and Dm extending in a column direction for transmitting data signals.

In addition, the display unit 100 receives a pixel power source ELVDD and a base power source ELVSS supplied from a power source supply unit (not shown) for driving the display unit 100. Therefore, the display unit 100 displays images by emitting light that corresponds to currents flowing through the OLEDs in accordance with the scan signals, the emission control signals, the data signals, the pixel power source ELVDD, and the base power source ELVSS.

The data driver 200 generates the data signals by using image signals R, G, and B data having red, blue, and green components. The data driver 200 is coupled to the data lines D1, D2 . . . , Dm−1, and Dm of the display unit 100 to apply the generated data signals to the display unit 100.

The scan driver 300 for generating the scan signals is coupled to the scan lines S1, S2 . . . , Sn−1, and Sn to transmit the generated scan signals to specific rows of pixels 101 of the display unit 100. The data signals output from the data driver 200 are transmitted to the pixels 101 to which the scan signals are transmitted so that driving currents are generated to flow to the OLEDs of the pixels 101.

The emission control driver 400 for generating emission control signals is coupled to the emission control lines E1, E2 . . . , En−1, and En to transmit the generated emission control signals to specific rows of pixels 101 of the display unit 100. Here, the emission control driver 400 prevents driving currents from flowing to the OLEDs of the pixels 101 for a same time duration among the pixels 101 at the initial stage of driving the organic light emitting display. In order to prevent the driving currents from flowing to the pixels 101, the emission control driver 400 generates and transmits an Off signal to the emission control lines E1, E2 . . . , En−1, and En.

The controller 500 transmits the image signals R, G, and B data, data driver control signals DSC, scan driver control signals SCS, and emission control driver control signals ECS to the data driver 200, the scan driver 300, and the emission control driver 400, respectively. Therefore, the data driver 200, the scan driver 300, and the emission control driver 400 receive the signals to control the operations of the pixels 101 so that an image can be displayed. In addition, the controller 500 transmits a first control signal ESR to the emission control driver 400 to generate the Off signal.

Figure 2:
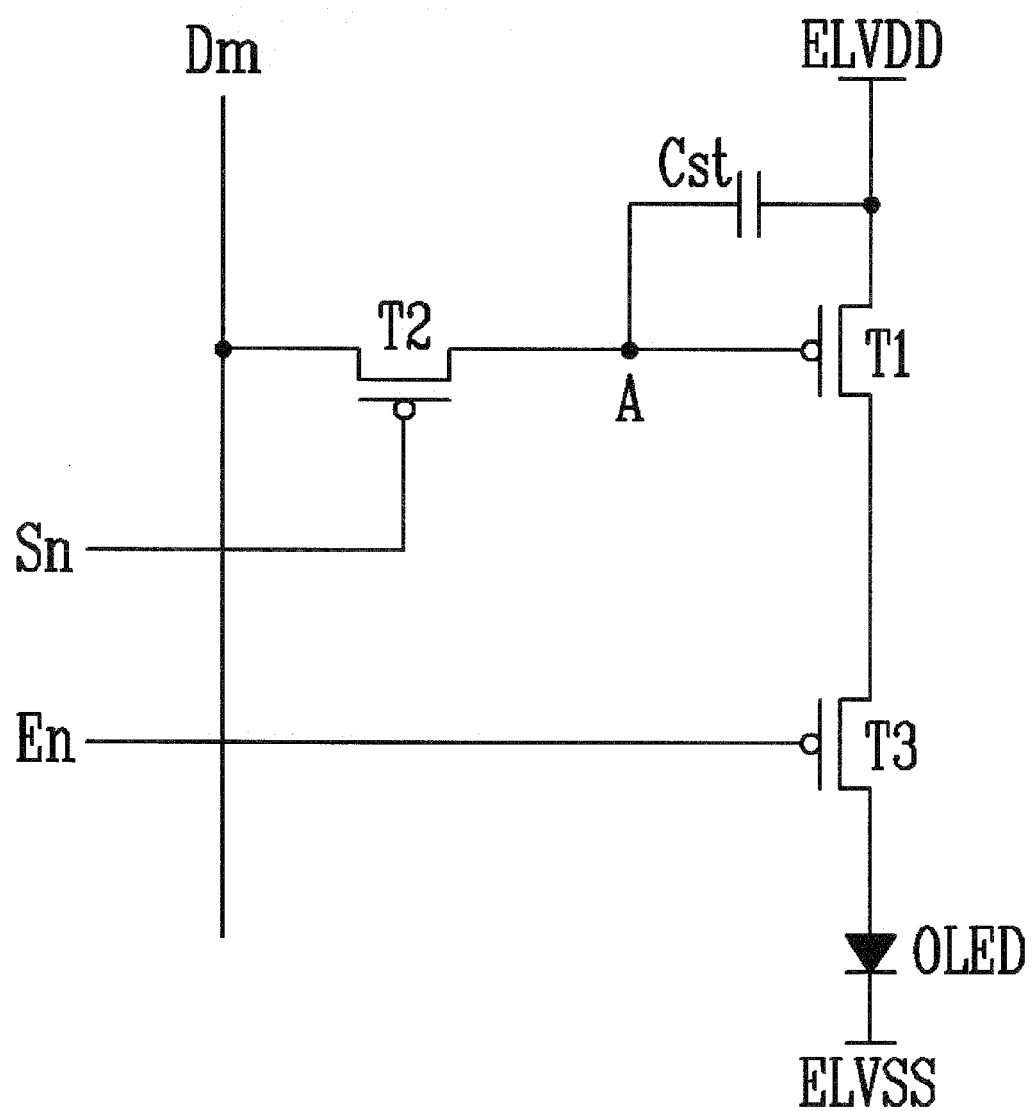
FIG. 2 is a schematic circuit diagram for illustrating the structure of the pixel of the organic light emitting display of FIG. 1.

FIG. 2 is a schematic circuit diagram for illustrating the structure of the pixel of the organic light emitting display of FIG. 1. Referring to FIG. 2, the pixel includes a first transistor T1, a second transistor T2, a third transistor T3, a capacitor Cst, and an OLED.

Referring to the first transistor T1, its source is coupled to the pixel power source ELVDD, its drain is coupled to the source of the third transistor T3, and its gate is coupled to a first node A. Referring to the second transistor T2, its source is coupled to a data line, its drain is coupled to the first node A, and its gate is coupled to the scan line Sn. Referring to the third transistor T3, its source is coupled to the drain of the first transistor T1, its drain is coupled to the OLED, and its gate is coupled to the emission control line En. In addition, referring to the capacitor Cst, its first electrode is coupled to the pixel power source ELVDD and its second electrode is coupled to the first node A. The OLED includes an anode electrode, a cathode electrode, and an emission layer. The anode electrode is coupled to the drain of the third transistor T3, and the cathode electrode is coupled to the base power source ELVSS. In the OLED, when a current flows from the anode electrode to the cathode electrode, the emission layer emits light to correspond to the amount of the flowing current. EQUATION 1 illustrates an equation for determining an amount of current that flows through the drain of the first transistor T1.

$$I_d = \frac{\beta}{2}(ELVDD - Vdata - Vth)^2 \qquad \text{EQUATION 1}$$

Here, $I_d$, Vdata, ELVDD, Vth, and β represent the current that flows through the drain of the first transistor T1, the voltage of the data signal, the voltage of the pixel power source transmitted to the source of the first transistor T1, the threshold voltage of the first transistor T1, and a constant, respectively.

In the organic light emitting display having the above described pixel structure, the third transistor T3 is maintained to be almost always turned on by the emission control signals. However, when the pixel power source ELVDD and the base power source ELVSS are instantaneously turned on at the initial stage of driving the organic light emitting display, a voltage is formed between the source and the gate of the first transistor T1 so that a corresponding current can flow from the source of the first transistor T1 to the drain of the first transistor T1. As such, when the third transistor T3 is turned on, the current flows from the source of the first transistor T1 to the drain of the first transistor T1 and is input to the OLED. Therefore, the OLED included in the pixel emits light at an undesired point of time.

Figure 3:
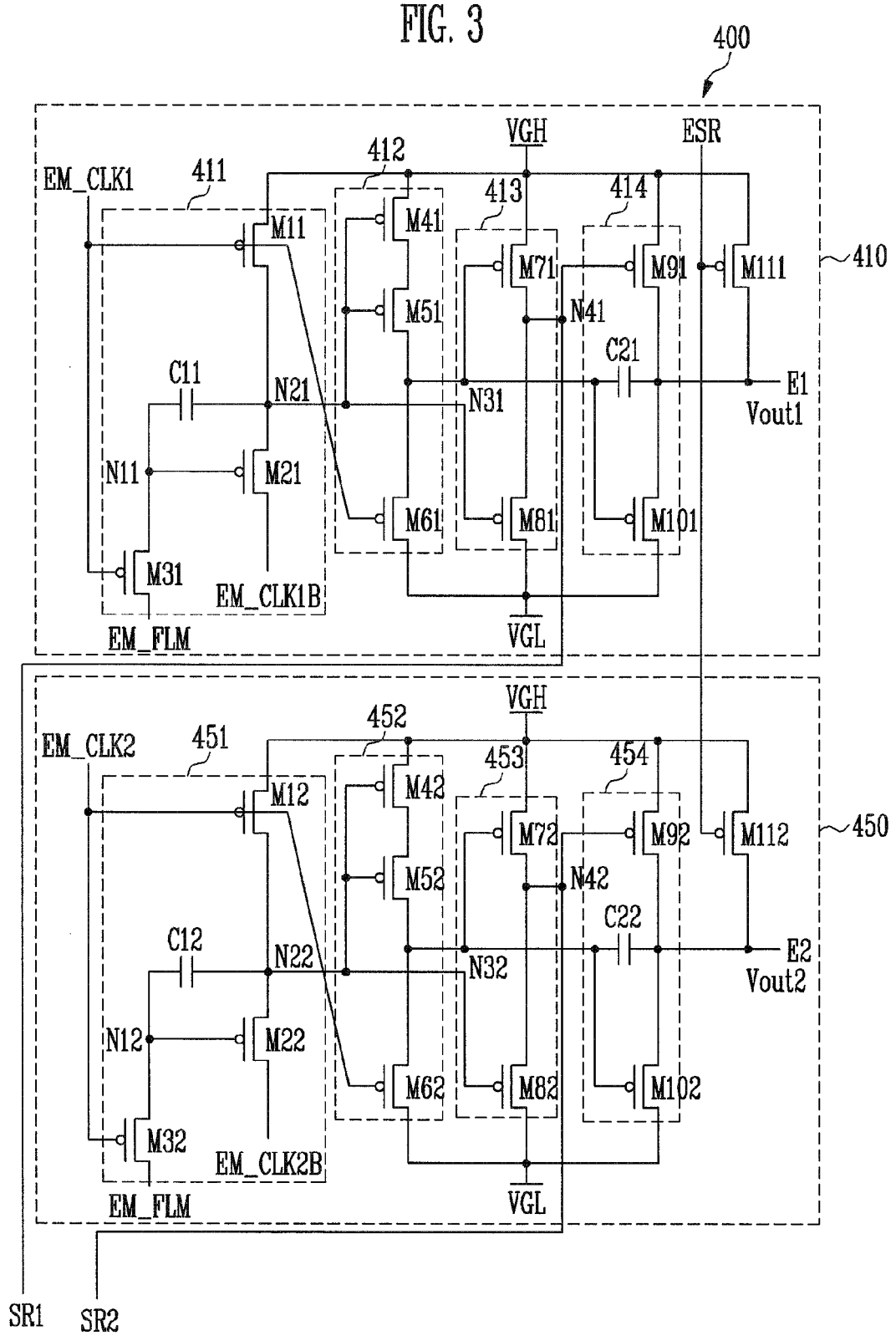
FIG. 3 is a schematic circuit diagram for illustrating a part of the emission control driver of the organic light emitting display of FIG. 1.

FIG. 3 is a schematic circuit diagram for illustrating a part of the emission control driver of the organic light emitting display of FIG. 1. Referring to FIG. 3, the emission control driver 400 includes a plurality of stages for generating and outputting the emission control signals. According to an embodiment of the present invention, for the convenience of description, only two exemplary stages, that is, a first stage 410 and a second stage 450 are illustrated in FIG. 3. The stages 410 and 450 include first signal processors 411 and 451, second signal processors 412 and 452, third signal processors 413 and 453, fourth signal processors 414 and 454, and switches M111 and M112, respectively.

The operations of the first signal processors 411 and 451, the second signal processors 412 and 452, the third signal processors 413 and 453, the fourth signal processors 414 and 454, and the switches M111 and M112 included in the stages 410 and 450, respectively, are described in the following paragraphs.

The first signal processors 411 and 451 each receive a start pulse EM_FLM or the shift signal output from a previous stage, a first clock EM_CLK1 or a second clock EM_CLK2, and a first sub-clock EM_CLK1B or a second sub-clock EM_CLK2B to output a first power source VGH or a second power source VGL. The second signal processors 412 and 452 receive the voltages output from the first signal processors 411 and 451, respectively, to invert the received voltages and to output the inverted voltages. The third signal processors 413 and 453 receive the voltages output from the second signal processors 412 and 452, respectively, to invert the received voltages, to output the inverted voltages, and to generate shift signals SR1 and SR2, respectively, transmitted to a later stage. The fourth signal processors 414 and 454 receive the voltages output from the third signal processors 413 and 453, respectively, to invert the received voltages and to output the inverted voltages. The switches M111 and M112 each perform switching between the first power source VGH and output ends Vout1 and Vout2, respectively, in response to a first control signal ESR.

First, the structure of the first stage 410 will be described. The first signal processor 411 includes a first transistor M11, a second transistor M21, a third transistor M31, and a first capacitor C11. The first power source VGH is transmitted to the source of the first transistor M11. The drain of the first transistor M11 is coupled to a second node N21. The first clock EM_CLK1 is received through the gate of the first transistor M11. Referring to the second transistor M21, its source is coupled to the second node N21, its drain receives the first sub-clock EM_CLK1B, and its gate is coupled to a first node N11. The third transistor M31 receives the start pulse EM_FLM through its source. The drain of the third transistor M31 is coupled to the first node N11. The gate of the third transistor M31 receives the first clock EM_CLK1.

The second signal processor 412 includes a fourth transistor M41, a fifth transistor M51, and a sixth transistor M61. The first power source VGH is transmitted to the source of the fourth transistor M41. The drain of the fourth transistor M41 is coupled to the source of the fifth transistor M51. The gate of the fourth transistor M41 is coupled to the second node N21. Referring to the fifth transistor M51, its source is coupled to the drain of the fourth transistor M41, its drain is coupled to a third node N31, and its gate is coupled to the second node N21. Referring to the sixth transistor M61, its source is coupled to the third node N31 and its drain is coupled to the second power source VGL that has a lower voltage than the first power source VGH. The sixth transistor M61 receives the first clock EM_CLK1 through its gate.

The third signal processor 413 includes a seventh transistor M71 and an eighth transistor M81. Referring to the seventh transistor M71, its source is coupled to the first power source VGH, its drain is coupled to a fourth node N41, and its gate is coupled to the third node N31. Referring to the eighth transistor M81, its source is coupled to the fourth node N41, its drain is coupled to the second power source VGL, and its gate is coupled to the second node N21. In addition, the fourth node N41 is coupled to the source of the third transistor (not shown) of a third stage (not shown). The voltage of the fourth node N41 becomes the first shift signal SR1 transmitted to the third stage.

The fourth signal processor 414 includes a ninth transistor M91, a tenth transistor M101, and a second capacitor C21. Referring to the ninth transistor M91, its source is coupled to the first power source VGH, its drain is coupled to the output end Vout1, and its gate is coupled to the fourth node N41. Referring to the tenth transistor M101, its source is coupled to the output end Vout1, its drain is coupled to the second power source VGL, and its gate is coupled to the third node N31. Referring to the second capacitor C21, its first electrode is coupled to the third node N31 and its second electrode is coupled to the output end Vout1.

The switch M111 is realized, for example, by a transistor. The source of the transistor is coupled to the first power source VGH. The drain of the transistor is coupled to the output end Vout1. The first control signal ESR is received through the gate of the transistor. The output end Vout1 is coupled to the emission control line E1 of the display unit 100.

The second stage 450 includes first to tenth transistors M12 to M102, the switch M112, a first capacitor C12, and a second capacitor C22. The second stage 450 has substantially the same circuit structure as the first stage 410 according to the embodiment shown in FIG. 3. The first clock EM_CLK1 and the first sub-clock EM_CLK1B are transmitted to the first stage 410. However, the second clock EM_CLK2 and the second sub-clock EM_CLK2B are transmitted to the second stage 450. The second clock EM_CLK2 and the second sub-clock EM_CLK2B are delayed from the first clock EM_CLK1 and the first sub-clock EM_CLK1B, respectively, by one clock. Therefore, the emission control signal output from the second stage 450 is delayed from the emission control signal output from the first stage 410. In addition, the voltage of the fourth node N42 of the second stage 450 becomes the second shift signal SR2 transmitted to a fourth stage (not shown). The second shift signal SR2 is transmitted to the source of the third transistor (not shown) of the fourth stage.

Figure 4:
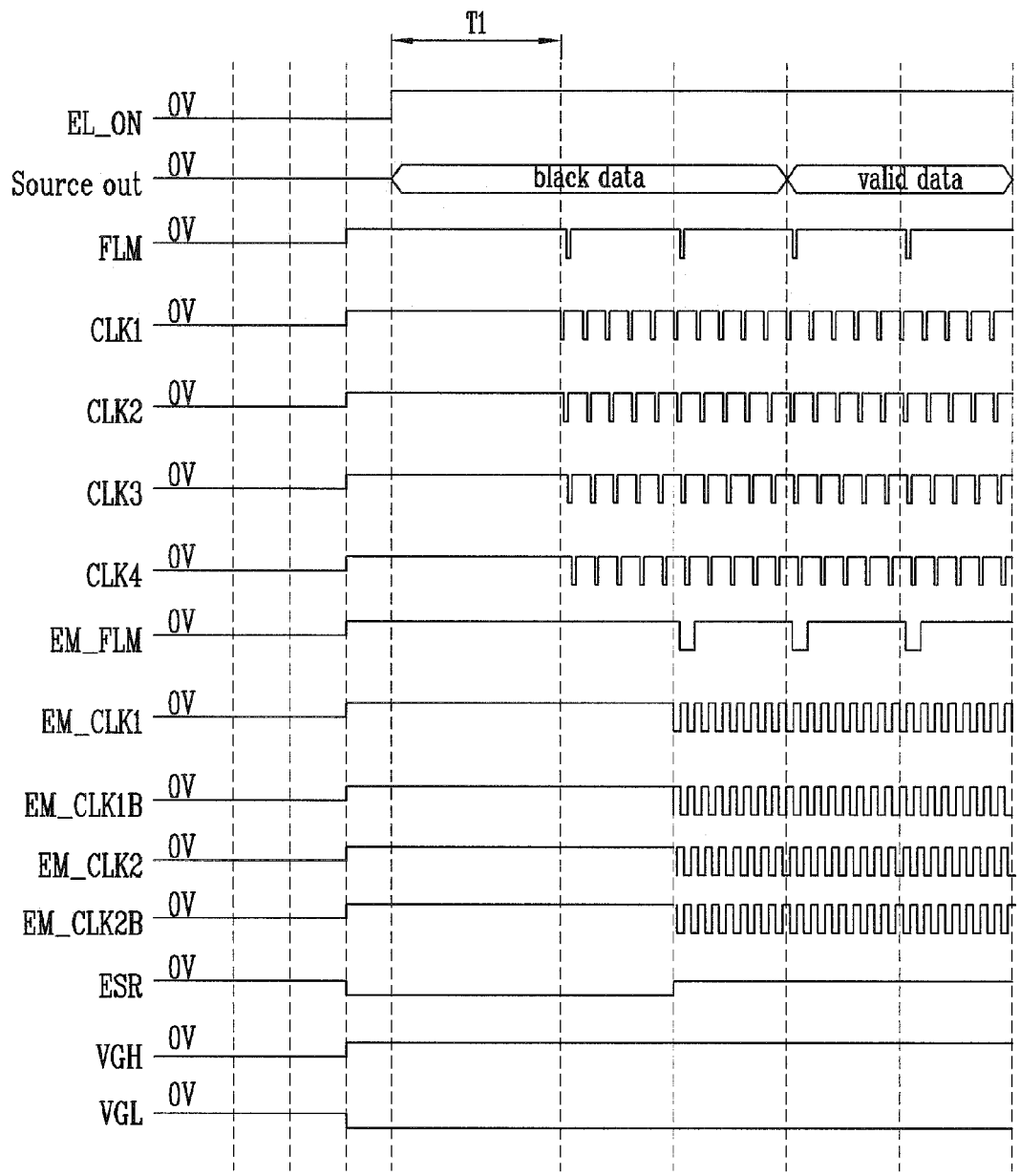
FIG. 4 is a timing diagram for illustrating the operation of the emission control driver of FIG. 3.

FIG. 4 is a timing diagram for illustrating the operation of the emission control driver of FIG. 3. Description is made with reference to FIG. 4.

Referring to FIG. 4, first, the first control signal ESR is at a low level, and the first power source VGH and the second power source VGL are turned on. Since the first control signal ESR is at the low level, the switches M111, M112, for example, are turned on so that the voltage of the first power source VGH is transmitted to the output end Vout1. Therefore, the voltage of the first power source VGH is output through the emission control lines E1, E2 . . . , En−1, and En coupled to the output ends Vout1, Vout2, . . . . Since the voltage of the first power source VGH is at a high level, the emission control signals output through the emission control signals E1, E2, . . . , En−1, and En are maintained at a high level. Therefore, the third transistor T3 illustrated in FIG. 2 is turned off to prevent a current from flowing to the OLED. Therefore, it is possible to prevent erroneous emission from being generated at the initial stage of driving the organic light emitting display.

In a period T1, while the first control signal ESR is maintained at the low level, and the pixel power source ELVDD and the base power source ELVSS are transmitted to the pixels, the data signals have black information (e.g., black color data). Here, the length of the period T1 is maintained for at least one frame. When the period T1 is no less than one frame, a voltage corresponding to data of black is charged in the capacitors Cst included in all of the pixels 101 of the display unit 100.

After the scan driver 300 operates first, the emission control driver 400 operates. That is, after the scan driver 300 receives the start pulse FLM and clocks CLK1, CLK2, CLK3, and CLK4 and starts to be driven, with the lapse of a uniform time among all the pixels 101, the start pulse EM_FLM is input to the emission control driver 400. At this time, the first control signal ESR is maintained at a high level so that the switches M111, M112, for example, are turned off. When the switches M111, M112 are turned off, the voltage of the first power source VGH is prevented from being transmitted to the output ends Vout1, Vout2. At the same time, the first clock EM_CLK1, the first sub-clock EM_CLK1B, and the start pulse EM_FLM are transmitted to the first stage 410. At this time, the first signal ESR is maintained at the high level so that the switch M111 is turned off. That is, the emission control driver 400 starts to be normally driven. When the emission control driver 400 is normally driven, the emission control signals are at a low level so that the current can flow to the OLED. However, since the data corresponding to black is stored in each of the capacitors Cst included in the pixels 101, the pixels 101 display black. Therefore, the erroneous emission is not generated by the pixels 101.

The operation of the emission control driver 400 will be described in more detail. First, the first clock EM_CLK1 is at a low level, the first sub-clock EM_CLK1B is at a high level, and the start pulse EM_FLM is at a low level. That is, the first transistor Ml 1 and the third transistor M31 of the first signal processor 411 are turned on. Therefore, a low voltage is transmitted to the first node N11 by the start pulse EM_FLM. When the low level (or low voltage) is transmitted to the first node N11, the second transistor M21 is turned on. At this time, the voltage of the first power source VGH is transmitted to the second node N21 by the first transistor M11, and the first sub-clock EM_CLK1B at the high level is transmitted by the second transistor M21. Therefore, the voltage of the second node N21 is maintained at the voltage of the first power source VGH to be at the high level.

Since the voltage of the second node N21 is maintained at the high level, and the first clock EM_CLK1 is at the low level, the fourth transistor M41 and the fifth transistor M51 are turned off, and the sixth transistor M61 is turned on. Therefore, the third node N31 is coupled to the second power source VGL through the sixth transistor M61 so that the voltage of the third node N31 is maintained at a low level.

Since the voltage of the third node N31 is supplied to the gate of the seventh transistor M71, the seventh transistor M71 is turned on when the third node N31 is at a low level. Since the voltage of the second node N21 is supplied to the gate of the eighth transistor M81, the eighth transistor M81 is turned off when the second node N21 is at a high level. Therefore, the voltage of the first power source VGH is transmitted to the fourth node N41 so that the voltage of the fourth node N41 is maintained at a high level.

Since the voltage of the fourth node N41 is supplied to the gate of the ninth transistor M91, the ninth transistor M91 is turned off when the fourth node N41 is at a high level. Since the voltage of the third node N31 is supplied to the gate of the tenth transistor M101, the tenth transistor M101 is turned on when the third node N31 is at a low level. Therefore, since the output end Vout1 is at a low level, the emission control signal E1 output through the output end Vout1 is at a low level. At this time, when the voltage of the output end Vout1 is reduced to the threshold voltage of the tenth transistor M101, the tenth transistor M101 is turned off. Therefore, the voltage of the output end Vout1 is no less than the threshold voltage of the tenth transistor M101. However, with the second capacitor C21 coupled between the third node N31 and the output end Vout1, when the voltage of the output end Vout1 is reduced, the voltage of the third node N31 is reduced more by the operation of the second capacitor C21. Therefore, even when the voltage of the output end Vout1 is reduced to the threshold voltage of the tenth transistor M101, the tenth transistor M101 is maintained to be turned on. That is, the voltage of the output end Vout1 is lower than the threshold voltage of the tenth transistor M101 so that the characteristics of the emission control signal output through the output end Vout1 are improved.

When the first clock EM_CLK1 is at a high level, the first sub-clock EM_CLK1B is at a low level, and the start pulse EM_FLM is at a low level, the first transistor M11 and the third transistor M31 are turned off. At this time, the first node N11 and the second node N21 are maintained at a low level by the first capacitor C11 so that the second transistor M21 is turned on.

Since the voltage of the second node N21 is maintained at a low level, and the first clock EM_CLK1 is at the high level, the fourth transistor M41 and the fifth transistor M51 are turned on, and the sixth transistor M61 is turned off. Therefore, the third node N31 is coupled to the first power source VGH through the fourth transistor M41 and the fifth transistor M51 so that the voltage of the third node N31 is maintained at a high level.

Since the voltage of the third node N31 is supplied to the gate of the seventh transistor M71, the seventh transistor M71 is turned off. Since the voltage of the second node N21 is supplied to the gate of the eighth transistor M81, the eighth transistor M81 is turned on. Therefore, the voltage of the second power source VGL is transmitted to the fourth node N41 so that the voltage of the fourth node N41 is maintained at a low level.

Since the voltage of the fourth node N41 is supplied to the gate of the ninth transistor M91, the ninth transistor M91 is turned on. Since the voltage of the third node N31 is supplied to the gate of the tenth transistor M101, the tenth transistor M101 is turned off. Therefore, the output end Vout1 is at a high level so that the emission control signal output through the output end Vout1 is at a high level.

When the first clock EM_CLK1 is at a low level, the first sub-clock EM_CLK1B is at a high level, and the start pulse FLM is at a high level, since the third transistor M31 is turned on, the voltage of the first node N11 is at a high level due to the start pulse EM_FLM. When the voltage of the first node N11 is at the high level, the second transistor M21 is turned off. In addition, since the first transistor M11 is turned on, the first power source VGH is transmitted to the second node N21 so that the voltage of the second node N21 is at a high level.

Since the voltage of the second node N21 is maintained at the high level, and the first clock EM_CLK1 is at a low level, the fourth transistor M41 and the fifth transistor M51 are turned off, and the sixth transistor M61 is turned on. Therefore, the third node N31 is coupled to the second power source VGL through the sixth transistor M61 so that the voltage of the third node N31 is maintained at a low level.

Since the voltage of the third node N31 is supplied to the gate of the seventh transistor M71, the seventh transistor M71 is turned on. Since the voltage of the second node N21 is supplied to the gate of the eighth transistor M81, the eighth transistor M81 is turned off. Therefore, the voltage of the first power source VGH is transmitted to the fourth node N41 so that the voltage of the fourth node N41 is maintained at a high level.

Since the voltage of the fourth node N41 is supplied to the gate of the ninth transistor M91, the ninth transistor M91 is turned off. Since the voltage of the third node N31 is supplied to the gate of the tenth transistor M101, the tenth transistor M101 is turned on. Therefore, the output end Vout1 is at a low level so that the emission control signal output through the output end Vout1 is at a low level.

When the first clock EM_CLK1 is at a high level, the first sub-clock EM_CLK1B is at a low level, and the start pulse FLM is at a high level, the first transistor M11 and the third transistor M31 are turned off. At this time, since the voltages of the first node N11 and the second node N21 are maintained by the first capacitor C11, the voltages of the first node N11 and the second node N21 are at a high level. When the first node N11 is at the high level, the second transistor M21 is turned off.

Since the voltage of the second node N21 is maintained at the high level, and the first clock EM_CLK1 is at a high level, the fourth transistor M41, the fifth transistor M51, and the sixth transistor M61 are turned off. However, since the voltages of the third node N31 and the output end Vout1 are maintained by the second capacitor C21, the third node N31 and the output end Vout1 are at a low level. Therefore, the emission control signal E1 is at a low level. Since the third node N31 is at the low level, the seventh transistor M71 is maintained to be turned on. At this time, since the second node N21 is at the high level, the eighth transistor M81 is turned off. Therefore, the fourth node N41 is maintained at a high level. Therefore, the voltage of the fourth node N41 at the high level is transmitted to the third stage.

While the present invention has been described in connection with certain exemplary embodiments, it is to be understood that the present invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   a display unit comprising data lines, scan lines, emission control lines, and a plurality of pixels coupled to the data lines, the scan lines, and the emission control lines;
   a data driver coupled to the data lines for transmitting data signals;
   a scan driver coupled to the scan lines for transmitting scan signals;
   an emission control driver coupled to the emission control lines for transmitting emission control signals; and
   a controller for transmitting a plurality of control signals for controlling the data driver, the scan driver, and the emission control driver, and outputting a first control signal to prevent currents from flowing to organic light emitting diodes of the pixels,
   wherein the emission control driver further comprises a switch for outputting a voltage of a first power source to an output end of the emission control driver for outputting the emission control signals in response to the first control signal,
   wherein, after the first control signal is transmitted, voltages of a pixel power source and a base power source are transmitted to the pixels, and the data driver is configured to generate and transmit a black data signal to the pixels from a point in time in which the voltages of the pixel power source and the base power source begin to be transmitted to the pixels to a point in time after the emission control driver generates the emission control signals,
   wherein, after at least one frame elapses after the voltages of the pixel power source and the base power source are transmitted, the scan driver operates starts to be driven.

2. The organic light emitting display as claimed in claim 1, wherein the emission control driver comprises a plurality of stages, and
   wherein a stage of the plurality of stages comprises:
   a first signal processor for receiving a start pulse or a shift signal output from a previous stage, a first clock, and a sub-signal of the first clock to output a first voltage from a first power source or a second power source;
   a second signal processor for receiving the first voltage and outputting a second voltage that is an inverted voltage of the first voltage;
   a third signal processor for receiving the second voltage and outputting a third voltage that is an inverted voltage of the second voltage, and generating a shift signal that is transmitted to a subsequent stage of the plurality of stages;
   a fourth signal processor for receiving the third voltage and outputting a fourth voltage that is an inverted voltage of the third voltage; and
   a switch for performing switching between the first power source and an output end of the stage in response to the first control signal.

3. The organic light emitting display as claimed in claim 2, wherein the first signal processor comprises a first transistor, a second transistor, a third transistor, and a first capacitor,
   wherein the first transistor has a source for receiving a first power source, a drain coupled to a second node, and a gate for receiving the first clock,
   wherein the second transistor has a source coupled to the second node, a drain for receiving a first sub-clock, and a gate coupled to a first node,
   wherein the third transistor has a source for receiving a start pulse or a first shift signal output from a previous stage, a drain coupled to the first node, and a gate for receiving the first clock, and
   wherein the first capacitor is coupled between the first node and the second node.

4. The organic light emitting display as claimed in claim 2, wherein the second signal processor comprises a fourth transistor, a fifth transistor, and a sixth transistor,
   wherein the fourth transistor has a source coupled to the first power source, a drain coupled to a source of the fifth transistor, and a gate for receiving an output voltage of the first signal processor,
   wherein the fifth transistor has its source coupled to the drain of the fourth transistor, a drain coupled to a third node, and a gate for receiving the output voltage of the first signal processor, and
   wherein the sixth transistor has a source coupled to the third node, a drain coupled to the second power source, and a gate for receiving the first clock.

5. The organic light emitting display as claimed in claim 2, wherein the third signal processor comprises a seventh transistor and an eighth transistor,
   wherein the seventh transistor has a source coupled to the first power source, a drain coupled to a fourth node, and a gate for receiving an output signal of the second signal processor to output a first shift signal, and
   wherein the eighth transistor has a source coupled to the fourth node, a drain coupled to the second power source, and a gate for receiving an output voltage of the first signal processor.

6. The organic light emitting display as claimed in claim 2, wherein the fourth signal processor comprises:
   a ninth transistor having a source coupled to the first power source, a drain coupled to the output end of the stage, and a gate for receiving an output signal of the third signal processor;
   a tenth transistor having a source coupled to the output end of the stage, a drain coupled to the second power source, and a gate for receiving an output signal of the second signal processor; and
   a second capacitor coupled between the output end of the stage and the gate of the tenth transistor.

7. The organic light emitting display as claimed in claim 1, wherein each of the pixels comprises:
- an organic light emitting diode (OLED) for emitting light in response to a driving current flowing from a pixel power source to a base power source;
- a first transistor for generating the driving current in response to the data signals;
- a second transistor for transmitting the data signals to the gate of the first transistor in response to the scan signals;
- a third transistor for switching the flow of the driving current in response to the emission control signals; and
- a capacitor for maintaining a gate voltage of the first transistor.

8. A method of driving an organic light emitting display comprising an emission control driver and pixels having transistors for switching driving currents in response to emission control signals, each of the pixels having an organic light emitting diode (OLED) for receiving a corresponding one of the driving currents in response to the switching operations of the transistors, the method comprising:
- receiving a first control signal for a time duration in which a voltage for turning off the transistors is output from the emission control driver; and
- receiving the first control signal by a switch included in the emission control driver for the time duration in which a voltage of a first power source for turning off the transistors is output to an output end of the emission control driver via the switch, wherein, after the first control signal is transmitted, voltages of a pixel power source and a base power source are transmitted to the pixels;
- receiving a start signal and clocks by the emission control driver to generate the emission control signals subsequent to the time duration, duration; and
- generating and transmitting a black data signal from a data driver to the pixels from a point in time in which the voltages of the pixel power source and the base power source begin to be transmitted to the pixels to a point in time after the emission control driver generates emission control signals,
- wherein, after at least one frame elapses after the voltages of the pixel power source and the base power source are transmitted, a scan driver operates starts to be driven.

9. An organic light emitting display comprising:
- a display unit comprising data lines, scan lines, emission control lines, and a plurality of pixels coupled to the data lines, the scan lines, and the emission control lines;
- a data driver coupled to the data lines for transmitting data signals;
- a scan driver coupled to the scan lines for transmitting scan signals; and
- an emission control driver coupled to the emission control lines for transmitting emission control signals,
- wherein the emission control driver is configured to prevent the pixels from emitting during an initial period after power is supplied to the display unit, and
- during the initial period, the data signals comprise data corresponding to black color,
- wherein the emission control driver comprises a plurality of stages, a stage of the plurality of stages comprising a switch for performing switching between a first power source and an output end of the stage in response to a first control signal,
- wherein, after the first control signal is transmitted, voltages of a pixel power source and a base power source are transmitted to the pixels, and the data driver is configured to generate and transmit a black data signal to the pixels from a point in time in which the voltages of the pixel power source and the base power source begin to be transmitted to the pixels to a point in time after the emission control driver generates the emission control signals, and
- wherein, after at least one frame elapses after the voltages of the pixel power source and the base power source are transmitted, the scan driver operates starts to be driven.

10. The organic light emitting display as claimed in claim 9, further comprising a controller for outputting the first control signal to the emission control driver,
- wherein the emission control driver is configured to prevent the pixels from emitting during the initial period in response to the first control signal.

11. The organic light emitting display as claimed in claim 10,
- wherein the stage of the plurality of stages further comprises:
- a first signal processor for receiving a start pulse or a shift signal output from a previous stage, a first clock, and a sub-signal of the first clock to output a first voltage from the first power source or a second power source;
- a second signal processor for receiving and inverting the first voltage to output a second voltage that is an inverted voltage of the first voltage;
- a third signal processor for receiving and inverting the second voltage to output a third voltage that is an inverted voltage of the second voltage, and generating a shift signal that is transmitted to a subsequent stage of the plurality of stages; and
- a fourth signal processor for receiving and inverting the third voltage to output a fourth voltage that is an inverted voltage of the third voltage.

* * * * *

UNITED STATES PATENT AND TRADEMARK OFFICE
CERTIFICATE OF CORRECTION

PATENT NO.         : 8,482,492 B2                                    Page 1 of 1
APPLICATION NO.    : 12/476189
DATED              : July 9, 2013
INVENTOR(S)        : Mi-Hae Kim et al.

It is certified that error appears in the above-identified patent and that said Letters Patent is hereby corrected as shown below:

In the Claims

Column 9, Claim 1, line 59          Delete "operates"

Column 11, Claim 8, line 33         Delete "duration,"

Column 11, Claim 8, line 42         Delete "operates"

Column 12, Claim 9, line 24         Delete "operates"

Signed and Sealed this
Twenty-fifth Day of November, 2014

Michelle K. Lee
*Deputy Director of the United States Patent and Trademark Office*